US012700717B2

(12) United States Patent
Meyer et al.

(10) Patent No.: US 12,700,717 B2
(45) Date of Patent: Aug. 4, 2026

(54) METHOD FOR PRODUCING MICRO-OPTICS ON SURFACE-EMITTING LASER DIODES (VCSEL)

(71) Applicant: Robert Bosch GmbH, Stuttgart (DE)

(72) Inventors: Johannes Meyer, Magstadt (DE);
Johannes Hofmann, Tuebingen (DE);
Tobias Wilm, Heimsheim (DE)

(73) Assignee: ROBERT BOSCH GMBH, Stuttgart (DE)

( * ) Notice: Subject to any disclaimer, the term of this patent is extended or adjusted under 35 U.S.C. 154(b) by 866 days.

(21) Appl. No.: 17/935,892

(22) Filed: Sep. 27, 2022

(65) Prior Publication Data

US 2023/0118706 A1      Apr. 20, 2023

(30) Foreign Application Priority Data

Oct. 18, 2021    (DE) ..................... 10 2021 211 736.8

(51) Int. Cl.
*H01S 5/183*          (2006.01)
*G03H 1/04*           (2006.01)
*H01S 5/42*           (2006.01)

(52) U.S. Cl.
CPC ....... *H01S 5/18386* (2013.01); *G03H 1/0402* (2013.01); *H01S 5/423* (2013.01); *G03H 2001/0413* (2013.01); *G03H 2001/0439* (2013.01); *G03H 2222/13* (2013.01); *G03H 2260/12* (2013.01)

(58) Field of Classification Search
CPC ...... H01S 5/18386; H01S 5/423; H01S 5/183; H01S 5/02257; G03H 1/0402; G03H 2001/0413; G03H 2001/0439; G03H 2222/13; G03H 2260/12; G03H 1/0005; G02B 5/32
See application file for complete search history.

(56) References Cited

U.S. PATENT DOCUMENTS

2022/0239056 A1* 7/2022 Septon ............... G01R 31/2635

* cited by examiner

*Primary Examiner* — Fernando L Toledo
*Assistant Examiner* — Jorge Andres Lopez
(74) *Attorney, Agent, or Firm* — NORTON ROSE FULBRIGHT US LLP

(57) ABSTRACT

A method for producing micro-optics on surface-emitting laser diodes. In a wafer-level operation, the micro-optics are preferably positioned directly on the VCSEL's forming, in each instance, a part of a coherent wafer.

15 Claims, 3 Drawing Sheets

METHOD FOR PRODUCING MICRO-OPTICS ON SURFACE-EMITTING LASER DIODES (VCSEL)

CROSS REFERENCE

The present application claims the benefit under 35 U.S.C. § 119 of German Patent Application No. DE 10 2021 211 736.8 filed on Oct. 18, 2021, which is expressly incorporated herein by reference in its entirety.

BACKGROUND INFORMATION

Surface-emitting laser diodes (vertical-cavity surface-emitting lasers (VCSEL's)) having micro-optics are already available in the related art. However, the conventional micro-optics are processed individually and subsequently positioned on the individual VCSEL, using active alignment, e.g., by adhesive bonding or laminating. However, this method is complex and, therefore, expensive. In addition, during the curing of the adhesive, the active alignment established beforehand may be partially destroyed again. Conventional alternatives that are not easily scalable, at least up to this point, also include 3-D printing of micro-optics onto a single VCSEL or direct insertion of metallic lenses into the individual VCSEL via etching processes/lithographic processes.

SUMMARY

The present invention starts out from a method for producing micro-optics on surface-emitting laser diodes (VCSEL's).

According to an example embodiment of the present invention, it is provided that, in particular, in a wafer-level operation, the micro-optics preferably be positioned directly on, in each instance, the one part of a VCSEL forming a coherent wafer. In this manner, cost-effective and easily scalable implementation of optics on VCSEL's may be obtained in an advantageous manner. A wafer-level operation may be advantageously used for scaling the production, which means that additional production expenditure may be limited in an advantageous manner. In addition, this may allow an advantageously flatter construction to be achieved, in particular, since the micro-optics are introduced directly into a layer situated on the upper surface of the VCSEL. "Micro-optics" are to be understood, in particular, as optics, whose dimensions lie in the order of magnitude of dimensions of individual VCSEL's. The dimensions of the micro-optics are preferably not greater in any spatial direction than 200% of the dimensions of the corresponding VCSEL in the same spatial direction. Micro-optics preferably take the form of a micro-optical component, in particular, a micro-optical component of classical optics (such as lenses, mirrors, prisms, holograms), whose dimensions are only a few orders of magnitude over the wavelength A of the light irradiating/radiating through them. The dimensions of the micro-optics preferably lie between the millimeter range and the micrometer range. The micro-optics are intended, in particular, for shaping the light beams leaving the respective VCSEL. A "surface-emitting laser diode" and/or a VCSEL should be understood, in particular, as a laser diode, in which the light is emitted perpendicularly to the plane of a semiconductor chip having the laser diode. A "wafer-level operation" should be understood, in particular, as an operation, which is carried out on an intact, in particular, unsectioned wafer. In particular, the wafer-level operation is executed in a wafer processing step. In particular, the wafer-level operation forms a part of a wafer processing operation. The "wafer-level operation" is preferably carried out in a wafer processing installation of a semiconductor fabrication plant. In particular, in the wafer-level operation, a plurality of micro-optics for different VCSEL's of the respective wafer are produced consecutively or at least partly simultaneously. In particular, the positioning of the micro-optics onto the VCSEL's of the wafer includes producing the micro-optics from a material layer applied to at least a large part of the wafer.

In addition, according to the present invention a method for producing micro-optics on surface-emitting laser diodes (VCSEL's) is provided. According to an example embodiment of the present invention, the method includes the method steps:

manufacturing a wafer having a plurality of VCSEL's;
  applying an, in particular, unfunctionalized photopolymer to the wafer having the VCSEL's; and
  imprinting the specific optical functions of the micro-optics assigned to, in each instance, one of the VCSEL's of the wafer.

In this manner, cost-effective and easily scalable implementation of optics on VCSEL's may be obtained in an advantageous manner. A wafer-level operation may be advantageously used for scaling the production, which means that additional production expenditure may be limited in an advantageous manner. In addition, optical exposure methods for producing the micro-optics may be advantageously used, which are based on principles which are conventional and established, such as an exposure operation in wafer processing. In this context, the photopolymer may be selected from a plurality of conventional photopolymer types; in particular, requirements for the photopolymer with regard to a suitability for hologram-based micro-optics (for example, for molecular mobility and/or long-term stability) having to be taken into consideration. In particular, the photopolymer is applied to the wafer having the fully-processed and finished VCSEL's. In particular, the photopolymer forms a layer applied to the VCSEL's. The photopolymer is applied directly to an aperture of the specific VCSEL; the aperture preferably including an upper distributed Bragg reflector (DBR) and a lower distributed Bragg reflector (DBR) of an optical resonator of the VCSEL, as well as an electrical via. An "unfunctionalized photopolymer" should be understood, in particular, as a photopolymer, which is free of optical functions, preferably, which is still unexposed. The optical function preferably forms a transmission hologram. Alternatively, or in addition, the method may also be used, however, to produce other optical functions, such as focusing lenses, beam splitters, multidot generators, prisms, line optics (cylindrical lenses), and/or diffractive optics. For example, a combination of several VCSEL's (of a wafer) may each be provided with diffractive functions, so that compact combining of the light beams of the plurality of VCSEL's (forming a VCSEL module) may be achieved.

In addition, according to an example embodiment of the present invention, the photopolymer is bonded or laminated onto the wafer having the VCSEL's. This advantageously allows a durable connection between the VCSEL and the photopolymer to be attained. In particular, the photopolymer is bonded or laminated onto the wafer prior to the imprinting of the optical function(s). In particular, during the bonding, an adhesive layer is produced between the VCSEL's and the photopolymer. The material of the adhesive is advantageously selected in such a manner, that a desired power of refraction may be attained. The adhesive is preferably made of a material, which has an index of refraction that is adapted to an index of refraction of the VCSEL and/or to an index of refraction of the photopolymer in such a manner, that reflections at interfaces between the adhesive and the VCSEL and/or between the adhesive and the photopolymer are reduced considerably/minimized. For example, the adhesive takes the form of an optically clear adhesive (OCA). OCA (or LOCA) adhesives have advantageous transparency properties and indices of refraction adapted to common optical materials (in particular, common types of glass and/or plastic). A specific embodiment including silicone-based OCA's is preferably used, since in this case, only slightly pronounced interactions with the photopolymer are to be expected.

In particular, the applied photopolymer layer is bleached, preferably after the functionalization via the imprinting of an optical function, in a controlled process, with the aid of a wide-band light source, e.g., with the aid of thermal radiation emitters, with the aid of visible LED's, and/or with the aid of UV LED's, in particular, with the aid of an incoherent source of incandescent light. Such bleaching is necessary, in particular, in the case of common photopolymer materials, in order to bring the originally photosensitive material into a stable state. In particular, cross-linking of the polymer and fixation of the holographic pattern is achieved by the bleaching. The bleaching process is also crucial for the transparency properties of the holographic pattern (in particular, a low degree of scattered light).

Alternatively, according to an example embodiment of the present invention, it is provided that the photopolymer be applied in liquid form to the wafer having the VCSEL's, in particular, in a spin-on operation or in a screen-printing operation. This advantageously allows a particularly high precision of the micro-optics to be attained. This advantageously allows a highly controlled accuracy of the photopolymer layer to be attained. In this manner, particularly exact adjustment of a thickness of the photopolymer layer is rendered advantageously possible. A "spin-on operation" is to be understood, in particular, as a rotation-coating method, in which, e.g., materials present in solution are spun onto a substrate. In this context, the wafer is fixed in position, in particular, on a rotary table, e.g., with the aid of vacuum suction, a desired amount of solution is applied by a dosing mechanism above the center of the wafer, and the solution is distributed uniformly over the wafer surface by rotation (centrifugal forces). Any excess material is spun off of the wafer. In particular, the liquid photopolymer is designed to cure after being applied.

In addition, prior to, during, or after the application of the micro-optics and, in particular, after application of the photopolymer, the VCSEL's of the wafer are characterized by a laser pulse; the laser pulse being generated by activating the VCSEL's of the wafer. In this manner, a precision of the produced micro-optics may be advantageously increased. In particular, this may allow micro-optics to be adapted individually to characteristics of the specific VCSEL. In particular, the laser pulse for characterizing the specific VCSEL is generated by the specific, activated VCSEL itself. In particular, the laser pulse is designed to characterize manufacturing-specific characteristics of the VCSEL's and peak wavelengths of the VCSEL's. In particular, "designed" is to be understood as specially programmed, rated and/or equipped. That an object is designed for a particular function, is to be understood to mean, in particular, that the object fulfills and/or executes this particular function in at least one application state and/or operating state. In particular, the laser pulse is provided to characterize the specific VCSEL, preferably, the light emission/the emission characteristics (spectrum, direction, beam shape, beam divergence angle, etc.) of the specific VCSEL. It is possible for the laser pulse to be intended for characterizing the photopolymer layer, as well. In particular, the VCSEL's are characterized by the laser pulse prior to exposure of the photopolymer layer. Alternatively, or in addition, using, in particular, the laser pulse or using a further laser pulse, it is possible for the VCSEL's of the wafer to be characterized with regard to their optical properties already prior to application of the photopolymer. An exposure device, in particular, an exposure device having a wave-forming component, e.g., a spatial light modulator (SLM), may advantageously be set and/or positioned optimally on the basis of the characterizing results of the specific VCSEL's. In particular, the characterization of the VCSEL is intended for ascertaining a degree of scatter, generated during the manufacture of the wafer as a function of the operation, of the emitted spectra/wavelengths of the VCSEL's of the wafer and/or a degree of scatter of divergence angles and/or deflection angles of the VCSEL's of the wafers, in order to compensate for it subsequently by adapted exposure of the photopolymer. In particular, the individual VCSEL's are activated electrically via contacts on a lower side of the wafer, in order to generate the laser pulse.

In addition, according to an example embodiment of the present invention, the laser pulses leaving the wafer, in particular, VCSEL-characterizing laser pulses, are measured by a sensor, for example, a wavefront sensor, and the measuring results of the sensor specific to each VCSEL are taken into account during the imprinting of the optical functions into the corresponding VCSEL. In this manner, a precision of the produced micro-optics may be advantageously increased. In particular, this may allow micro-optics to be adapted individually to the characteristics of the specific VCSEL. The sensor takes the form, in particular, of a device for measuring the directional and divergence characteristics of the laser pulse leaving the wafer. For example, the sensor may take the form of a wavefront sensor. In this context, for example, the wavefront sensor may take the form of a Hartmann-Shack sensor. In particular, during the imprinting of the optical function into the photopolymer of a VCSEL, the exposure device, e.g., the SLM, is placed in position precisely above the VCSEL and/or set in the exposure spectrum on the basis of the measuring results of the sensor.

If, in this instance, a duration of the laser pulse, which is used in the characterization of the VCSEL taking place after the application of the, in particular, unfunctionalized photopolymer, is selected to be temporally brief in such a manner, that exposure of the photopolymer is prevented at least substantially, then unwanted effects on the photopolymer, such as the formation of parasitic reflection holograms due to the laser pulse, may be advantageously prevented. In particular, the photopolymer has an exposure curve, in which an efficiency of the resulting optical function is plotted versus time; and the duration of the laser pulse being shorter than a period of time, in which the efficiency of the resulting optical function increases to a value of not more than 5%, preferably, not more than 10% of a maximum efficiency value. To imprint a diffraction grating into the photopolymer, an exposure time in the low two-digit millisecond range up to several seconds is typically selected. Thus, characterization of the VCSEL's, while preventing exposure of the photopolymer, should be selected to be suitably briefer. In addition, in particular, the imprinted dose in the form of the product of the optical power and exposure time is relevant to the exposure of the photopolymer. Thus, exposure of the photopolymer may be advantageously prevented by the selection of an appropriately low dose, as well. Furthermore, the short-term exposure of the photopolymer below the sensitivity threshold for the imprinting of a diffraction grating may contribute to activating the photopolymer material. In particular, in one specific embodiment of the method according to the present invention, material dynamics of the photopolymer material (e.g., exposure threshold or attainable refractive index modulation of the holographic pattern) may be influenced in a process-specific manner.

During the imprinting, if a transmission hologram, in particular, a volume transmission hologram, is produced in the photopolymer, a VCSEL particularly suitable for use in smart glasses having a retina scan display may advantageously be produced. In addition, transmission holograms permit varied adjustment of the optical function. In this manner, individual correction of manufacturing tolerances in single VCSEL's may be advantageously enabled. This may advantageously allow highly optimized micro-optics to be produced in the wafer-level operation. As an alternative, imprintings of other, in particular, reflective, dispersive, or diffracting optical functions are also possible. In particular, the optical function in the form of a volume Bragg grating is produced during the imprinting.

In addition, according to an example embodiment of the present invention, for producing the transmission hologram, two different exposure wave fronts are used, which are each selected, in particular, in such a manner, that by interference of the exposure wave fronts, the optical function to be obtained is produced in accordance with the holographic principle. In this manner, a precision of the produced micro-optics may be advantageously increased. In particular, this may allow micro-optics to be adapted individually to the characteristics of the specific VCSEL. In particular, the imprinting of the optical function with the aid of the two different exposure wave fronts takes place in the reverse direction for the later playback configuration of the transmission hologram. Due to this, the origin of the two exposure wavefronts is advantageously above the wafer (the side of the wafer, on which the photopolymer is applied).

In addition, according to an example embodiment of the present invention, a first exposure wavefront is provided for producing the intended optical function, and a second exposure wavefront is provided to compensate for manufacturing-specific characteristics of the specific VCSEL, which were ascertained, in particular, in light of the preceding VCSEL characterization. In this manner, a precision of the produced micro-optics may be advantageously increased. In particular, this may allow micro-optics to be adapted individually to the characteristics of the specific VCSEL. In this context, the first exposure wavefront corresponds, in particular, to the desired target wave of the transmission hologram. In this instance, the second exposure wavefront corresponds, in particular, to an emitted wavefront of the VCSEL, which was measured beforehand, in particular, with the aid of the sensor. In order to imprint micro-optics having, by way of example, focusing characteristics, a divergent wavefront (in this case, first exposure wavefront) and a convergent wavefront (in this case, second exposure wavefront) are needed, for example. The divergent wavefront is then used, in particular, for forming a focal point of the optical function, while the convergent wavefront is based on the emitted wavefront of the VCSEL with its manufacturing-specific characteristics (e.g., divergence angle, deflection angle, etc.) and/or corresponds to it. Consequently, in this example, the divergent wavefront is used, in order to imprint a focusing optical function into the photopolymer in the playback direction of the transmission hologram, while the convergent wavefront is used, in order to compensate for the manufacturing-specific characteristics of the corresponding VCSEL.

In addition, according to an example embodiment of the present invention, with the aid of the first exposure wavefront and/or with the aid of the second exposure wavefront, in particular, utilizing the Bragg equations, preferably, by precisely setting an SLM, with regard to the angular orientation of the exposure wavefront(s) relative to the photopolymer to be exposed, a correction of a peak wavelength generated by the VCSEL is imprinted into the transmission hologram. In this manner, the quality of the output of the VCSEL may be optimized by the transmission hologram. For this, in particular, the diffractive characteristics of the exposure device, in particular, of the SLM, may be used, in order to adjust an angle of incidence of the exposure wavefront(s) into the photopolymer highly precisely. In particular, the angle of incidence of the exposure wavefront (s) is controlled precisely by the SLM. Therefore, in light of the relationship between wavelength and angle from the Bragg equations, (by adjusting the angle of incidence of the exposure wavefront(s),) a peak efficiency of the transmission hologram may advantageously be set to a desired wavelength and/or to a desired transmission angle. In this connection, one makes use of the fact that wavefronts emitted by VCSEL's have a non-zero line width and diffract the desired wavelength of the line width into a target configuration, using a high hologram efficiency, while wavelengths of the line width differing from the desired wavelength are diffracted at a markedly reduced efficiency. By setting the angle of incidence of the exposure wavefront(s) into the photopolymer, unwanted secondary modes of the VCSEL may be filtered out and/or beam shaping of the VCSEL may be optimized in an advantageous manner. In the first case, the transmission hologram advantageously has, in addition, the function of a band-pass filter for the VCSEL.

In addition, according to an example embodiment of the present invention, the two different exposure wavefronts are coherent with respect to each other and/or are generated by a common source of radiation, in particular, a common spatial light modulator (SLM). In this manner, advantageous characteristics with regard to the production/exposure of the transmission hologram may be attained.

In addition, according to an example embodiment of the present invention, a wafer, which includes a plurality of surface-emitting laser diodes (VCSEL's) having micro-optics positioned directly on an upper side, is provided; the micro-optics being produced, in particular, by the method described above; the micro-optics preferably taking the form of transmission holograms. Due to this, cost-effective and easily scalable production of VCSEL's having integrated optics may be advantageously obtained, which are, for example, particularly advantageously suitable for generating display light beams in smart glasses (e.g., low magnitude coupled with high hologram precision).

In addition, according to an example embodiment of the present invention, surface-emitting laser diodes (VCSEL's) produced from the wafer by sectioning, are provided.

In this connection, the method of the present invention, the wafer of the present invention, and the surface-emitting laser diodes of the present invention shall not be limited to the use and specific embodiment described above. In particular, in order to achieve a functionality described here, the method of the present invention, the wafer of the present invention, and the surface-emitting laser diodes of the present invention may have a number of individual elements, component parts and units, as well as method steps, different from a number mentioned here. In addition, in the ranges of values indicated in this description, values lying within the above-mentioned limits are also to be acknowledged as described and as arbitrarily applicable.

BRIEF DESCRIPTION OF THE DRAWINGS

Further advantages are derived from the description of the figures. An exemplary embodiment of the present invention is depicted in the figures. The figures and the description include numerous features in combination. One skilled in the art will necessarily consider the features individually, as well, and unite them to form useful, further combinations.

DETAILED DESCRIPTION OF EXAMPLE EMBODIMENTS

Figure 1:
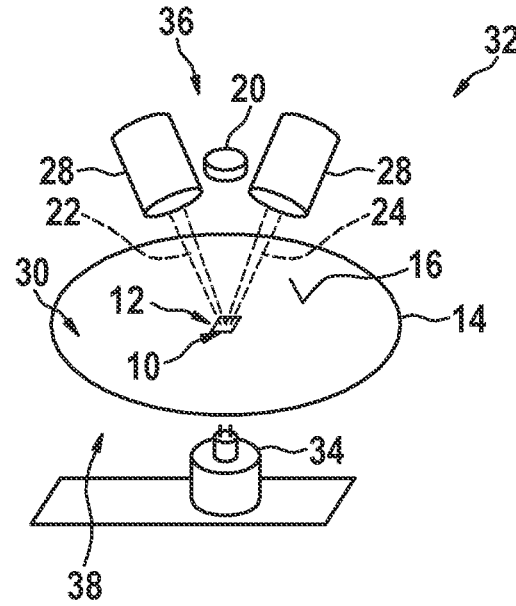
FIG. 1 shows a schematic representation of a manufacturing device for producing VCSEL's provided with micro-optics in a wafer-level operation, according to an example embodiment of the present invention.
Figure 2:
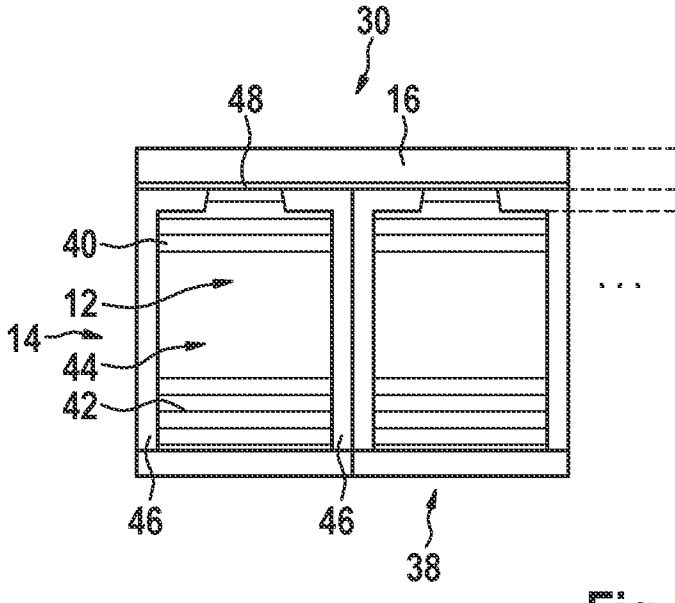
FIG. 2 shows a schematic cross section of a part of a wafer having VCSEL's, prior to the imprinting of an optical function of the micro-optics, according to an example embodiment of the present invention.
Figure 3:
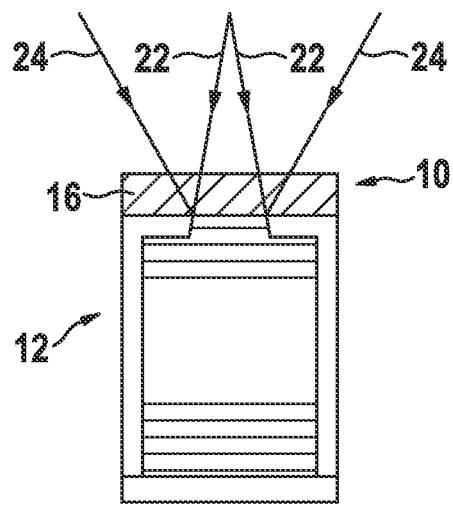
FIG. 3 shows a further schematic cross section of a part of a wafer having VCSEL's, during the imprinting of the optical function, according to an example embodiment of the present invention.

FIG. 1 schematically shows a manufacturing device 32 for producing surface-emitting laser diodes (VCSEL's) 12 provided with micro-optics 10 (see FIG. 2 or 3). Manufacturing device 32 is at least designed to provide VCSEL's 12 in wafer form with optical functions. Manufacturing device 32 is designed to support a wafer 14. The wafer 14 situated in manufacturing device 32 includes a photopolymer 16. Photopolymer 16 covers a side, in particular, an upper side 30 of wafer 14, in the form of a layer. For each of VCSEL's 12 of wafer 14, manufacturing device 32 is designed to imprint a(n) (specific) optical function into photopolymer 16. (Adapted) Micro-optics 10 are produced for each VCSEL 12 of wafer 14 by imprinting the optical functions (cf. FIG. 2 or 3). Finished wafer 14 then includes a plurality of VCSEL's 12, on each of whose upper sides 30 micro-optics 10 are positioned. Micro-optics 10 form, by way of example, transmission holograms; other optical functions also being possible. After completion of micro-optics 10, wafer 14 is sectioned, so that a plurality of individual surface-emitting laser diodes (12, VCSEL) are formed from wafer 14. The VCSEL's 12 having micro-optics 10 are intended, e.g., for use in smart glasses (not shown).

Manufacturing device 32 includes a prober 34. Prober 34 is designed to contact individual VCSEL's 12 of wafer 14 electrically. Prober 34 is designed to induce VCSEL's 12 to generate laser pulses 18 (see FIG. 5 or 6), in particular, characterizing and/or test laser pulses. Prober 34 is positioned on a lower side 38 of wafer 14. Prober 34 contacts VCSEL 12 from lower side 38 of wafer 14. Manufacturing device 32 includes an exposure device 36. Exposure device 36 forms a source of radiation. Exposure device 36 is situated on a side of wafer 14 opposite to prober 34, in particular, on an upper side 30 of wafer 14. Exposure device 36 takes the form of a spatial light modulator (SLM). Exposure device 36 is provided for imprinting the optical functions of micro-optics 10 into photopolymer 16. Exposure device 36 is designed to expose each VCSEL 12 of wafer 14 individually. Exposure device 36 is designed to emit at least two different exposure wavefronts 22, 24 for irradiating photopolymer 16. Exposure wavefronts 22, 24 may differ in transmission angle, beam divergence, etc. Exposure device 36 is supported above wafer 14 so as to be precisely positionable (not shown). Exposure device 36 includes adjustable optical axes for generating the two exposure wavefronts 22, 24.

Manufacturing device 32 includes a sensor 20. Sensor 20 takes the form of a device for measuring the directional and divergence characteristics of the laser pulse 18 leaving wafer 14. By way of example, sensor 20 takes the form of a wavefront sensor. Sensor 20 is situated on a side of wafer 14 opposite to prober 34, in particular, on upper side 30 of wafer 14. Sensor 20 is situated on the same side of wafer 14 as exposure device 36. Sensor 20 is provided for measuring wavefronts, in particular, light pulses generated by VCSEL's 12, in particular, after excitation of the VCSEL's 12 by prober 34. Sensor 20 is designed to measure light pulses, in particular, laser pulses 18 generated, in particular, by VCSEL's 12, in particular, after excitation of the VCSEL's 12 by prober 34. Sensor 20 transmits the measuring results to exposure device 36, which controls and/or carries out the irradiation on the basis of the measuring results.

FIG. 2 schematically shows a cross section of a part of the wafer 14 having VCSEL's 12, prior to the imprinting of the optical functions. Photopolymer 16 is applied to upper side 30 of wafer 14 in the form of a layer. In the example shown, an adhesive layer 48 is situated between photopolymer 16 and VCSEL 12. Adhesive layer 48 has an index of refraction adapted to an index of refraction of VCSEL 12 and/or of photopolymer 16. Each VCSEL 12 includes an upper Bragg reflector (distributed Bragg reflector (DBR)) 40. Each VCSEL 12 includes a lower Bragg reflector 42. The two Bragg reflectors 40, 42 of VCSEL 12 form an optical resonator 44 of VCSEL 12. VCSEL 12 includes electrical vias 46. Electrical vias 46 may be contacted from lower side 38 of wafer 14, e.g., for prober 34. FIG. 3 schematically shows one of the VCSEL's 12 of FIG. 2 during an imprinting operation, in which photopolymer 16 is exposed to the two exposure wavefronts 22, 24.

Figure 4:
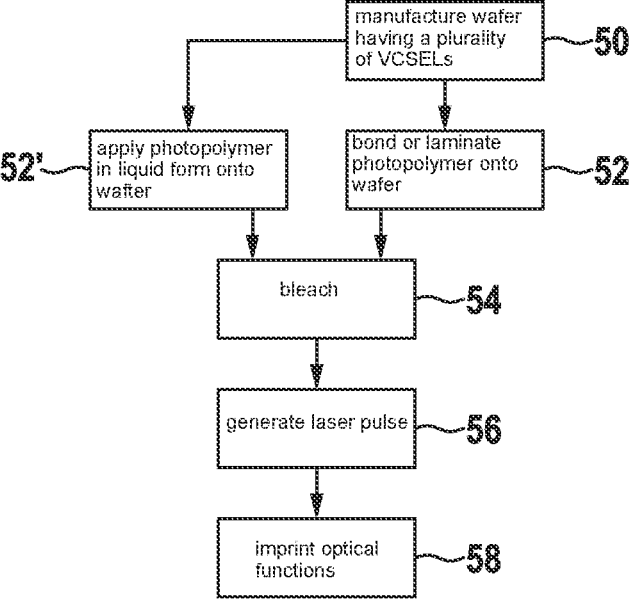
FIG. 4 shows a schematic flow chart of a method for producing the micro-optics on the VCSEL's, according to an example embodiment of the present invention.

FIG. 4 shows a schematic flow chart of a method for producing micro-optics 10 on VCSEL's 12. In the method, in a wafer-level operation, micro-optics 10 are positioned directly on, in each instance, the VCSEL's 12 forming a part of a coherent wafer 14. In at least one method step 50, the wafer 14 having the plurality of VCSEL's 12 is manufactured. For example, wafer 14 may be manufactured in an epitaxial operation. In at least one further method step 52, the photopolymer 16 that is still unfunctionalized is applied to upper side 30 of the wafer 14 having VCSEL's 12. In method step 52, photopolymer 16 is bonded or laminated onto the wafer 14 having VCSEL's 12. Alternatively, in a method step 52' alternative to method step 52, photopolymer 16 is applied in liquid form to the wafer 14 having VCSEL's 12. In this case, for example, a spin-on operation or a screen-printing operation are available for applying photopolymer 16. In a further method step 54, photopolymer 16 is subsequently bleached, in particular, in a controlled process, with the aid of a wide-band light spectrum, e.g., with the aid of an incoherent incandescent light. In this context, bleaching of photopolymer 16 prior to the exposure with a controlled dose may also be advantageous, in order to reduce the sensitivity of photopolymer 16 and, thus, the risk of imprinting interfering holograms, in particular, during the VCSEL characterization. In contrast to that, bleaching after the imprinting operation is used for setting the imprinted holographic pattern and bringing photopolymer 16 into a stationary state. As an option, the bleaching may advantageously be combined with a method step necessary for the VCSEL production, e.g., with a sintering process after a deposition. As an additional option, the bleaching may advantageously be carried out in a device, which is already present, in order to, e.g., carry out a characterization on the wafer level, using photoluminescence spectroscopy. In at least one further method step 56, VCSEL's 12 of wafer 14 are characterized by a laser pulse 18 prior to the positioning of micro-optics 10 and after the application of photopolymer 16. Exposure device 36, in particular, the SLM, is controlled with the aid of the measuring results of sensor 20. In method step 56, laser pulse 18 is generated via activation of VCSEL's 12 of wafer 14 by the VCSEL's 12 themselves. A duration of laser pulse 18, which is used in the characterization of VCSEL's 12 taking place after the application of photopolymer 16, is selected to be temporally brief in such a manner, that exposure of photopolymer 16 is at least substantially prevented (cf. FIG. 5 and the corresponding explanations, as well). As an option, the characterization step after the exposure of the holograms may also be advantageously combined with a burn-in step by laser diodes, if a suitable contacting area is present.

In at least one further method step 58, the specific optical functions are imprinted into the regions of the photopolymer 16 each assigned to one of VCSEL's 12. In method step 58, the micro-optics 10 assigned, in each instance, to one of the VCSEL's 12 of wafer 14 are produced by irradiating photopolymer 16 in a controlled manner, with the aid of exposure device 36. During the imprinting, the optical function is generated in photopolymer 16 in the form of a transmission hologram. In this context, in method step 58, the laser pulses 18 leaving wafer 14 are measured by sensor 20, and the measuring results of sensor 20 specific to each VCSEL 12 are taken into consideration during the imprinting of the optical functions into corresponding VCSEL 12. In method step 58, two different exposure wavefronts 22, 24 are used for generating the transmission hologram. The two exposure wavefronts 22, 24 contribute to the generation of the transmission hologram. The two exposure wavefronts 22, 24 are each selected in such a manner, that the optical function to be produced, in each instance, by interference of exposure wavefronts 22, 24, is produced according to the holographic principle. The two exposure wavefronts 22, 24 are generated by exposure device 36. The two different exposure wavefronts 22, 24 are coherent with respect to each other. The two different exposure wavefronts 22, 24 are generated by a common source of radiation 28 of exposure device 36, in particular, by a common spatial light modulator (SLM). A first exposure wavefront 22 of the two exposure wavefronts 22, 24 is designed to produce the intended optical function (cf. FIG. 3, as well). A second exposure wavefront 24 of exposure wavefronts 22, 24 is to compensate for manufacturing-specific characteristics of the specific VCSEL 12, which were ascertained, in particular, in light of the preceding VCSEL characterization of method step 56 (cf. FIG. 3, as well). With the aid of first exposure wavefront 22 and/or with the aid of second exposure wavefront 24, preferably, with the aid of a combination of exposure wavefronts 24, a correction of a peak wavelength 26 generated by VCSEL 12 (cf. FIG. 6, as well) is imprinted into the transmission hologram, in particular, using the Bragg equations.

Figure 5:
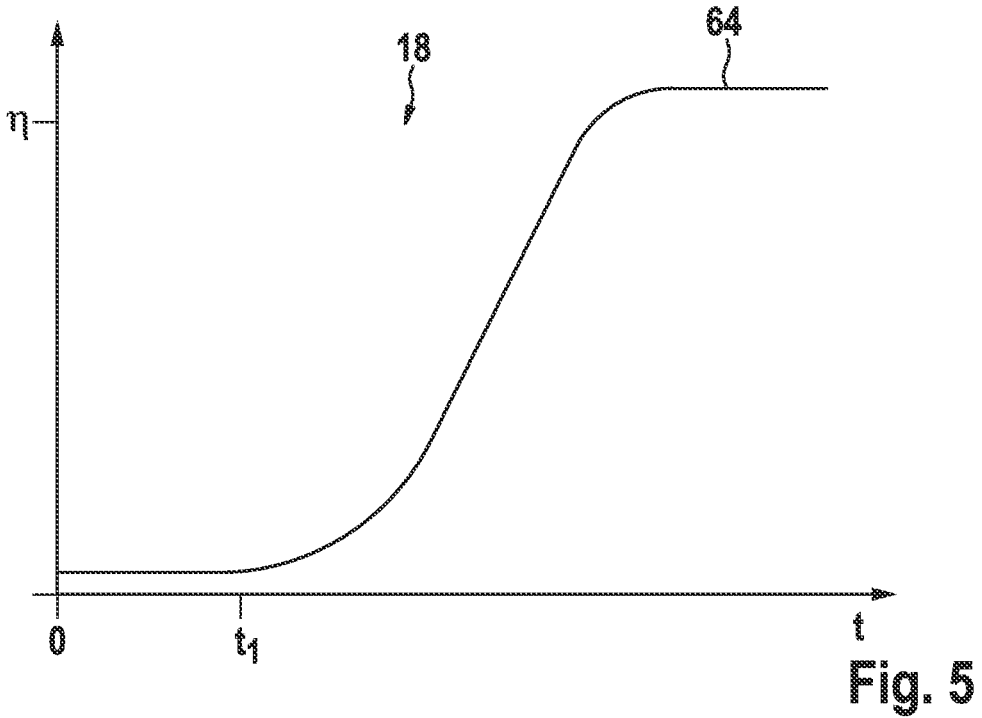
FIG. 5 shows a schematic exposure curve of the photopolymer, from which the micro-optics are produced by imprinting, according to an example embodiment of the present invention.

FIG. 5 schematically shows an exposure curve 64 of photopolymer 16, in which an exposure efficiency (y axis) is plotted versus an exposure time. The temporally brief laser pulse 18, which is generated by VCSEL's 12 and is used for characterizing VCSEL's 12, starts at time t=0 and ends at time t=t₁. The temporally brief laser pulse 18, which is generated by VCSEL's 12 and is used for characterizing VCSEL's 12, ends before the exposure efficiency curve of photopolymer 16 rises significantly. In this manner, an unintentional (partial) exposure of photopolymer 16 by laser pulse 18 is effectively prevented.

Figure 6:
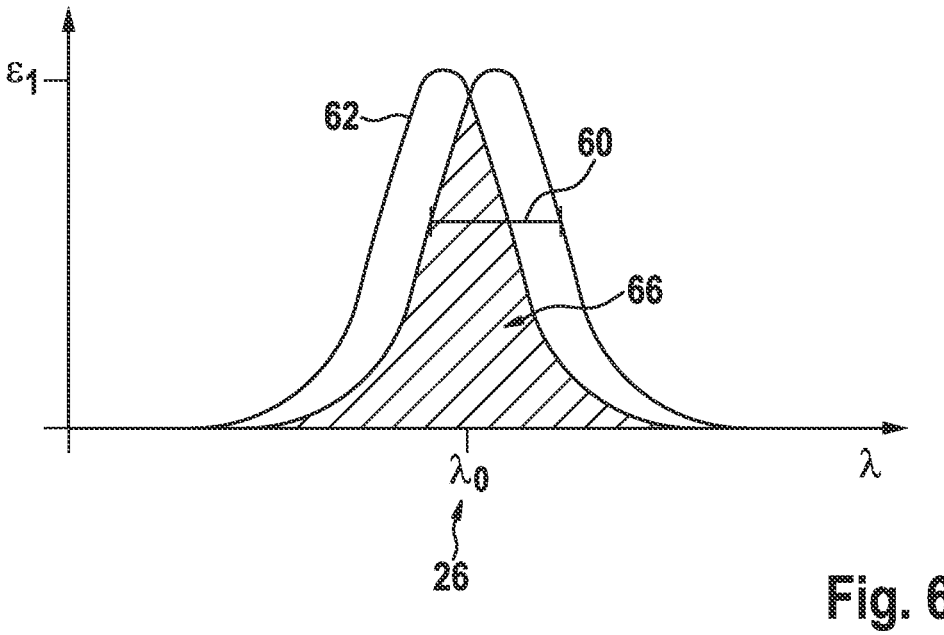
FIG. 6 shows a schematic linewidth of the VCSEL and an efficiency curve of a transmission hologram, which the micro-optics form, and which is positioned on the VCSEL, according to an example embodiment of the present invention.

FIG. 6 schematically shows a linewidth 60 of a VCSEL 12 with peak wavelength 26, as well as an efficiency curve 62 of the transmission hologram plotted versus the wavelength; the transmission hologram being formed by micro-optics 10 and being positioned on VCSEL 12. An overlap 66 of linewidth 60 and efficiency curve 62 may be set by adjusting the imprinted optical function.

What is claimed is:

1. A method for producing micro-optics on Vertical-Cavity Surface-Emitting Laser (VCSEL) diodes, the method comprising:
    in a wafer-level operation, positioning the micro-optics directly on the VCSEL's, of a wafer.

2. The method as recited in claim 1, wherein the micro-optics are positioned directly on an upper side of the coherent wafer.

3. The method as recited in claim 1, further comprising sectioning the coherent wafer to produce individual surface-emitting laser diodes, each formed from a portion of the coherent wafer and having micro-optics positioned directly on an upper side thereof.

4. A method for producing micro-optics on Vertical-Cavity Surface-Emitting Laser (VCSEL) diodes, the method comprising:
    in a wafer-level operation, positioning the micro-optics directly on the VCSEL's of a wafer;
    manufacturing a wafer having a plurality of VCSELS;
    applying an unfunctionalized photopolymer to the wafer having the VCSELS; and
    imprinting specific optical functions of the micro-optics assigned, in each instance, to one of the VCSELS of the wafer.

5. The method as recited in claim 4, wherein the photopolymer is bonded or laminated onto the wafer having the VCSELS.

6. The method as recited in claim 4, wherein the photopolymer is applied in liquid form to the wafer having the VCSELS, in a spin-on operation or in a screen-printing operation.

7. The method as recited in claim 4, wherein prior to, during, or after the positioning of the micro-optics and, after the application of the photopolymer, the VCSELS of the wafer are characterized by a laser pulse, the laser pulse being generated by activating the VCSELS of the wafer.

8. The method as recited in claim 7, wherein the laser pulses leaving wafer are measured by a sensor, and measuring results of the sensor specific to each VCSEL are taken into consideration during the imprinting of the optical functions into the corresponding VCSELS.

9. The method as recited in claim 7, wherein a duration of the laser pulse, which is used in the characterization of each VCSEL which takes place after the application of the unfunctionalized photopolymer, is selected to be temporally brief in such a manner that exposure of the photopolymer is at least substantially prevented.

10. The method as recited in claim 4, wherein during the imprinting, a transmission hologram is produced in the photopolymer.

11. The method as recited in claim 10, wherein two different exposure wavefronts are used for producing the transmission hologram.

12. The method as recited in claim 11, wherein a first exposure wavefront of the two exposure wavefronts is provided for producing the optical function, and a second exposure wavefront of the two exposure wavefronts is provided to compensate for manufacturing-specific characteristics of the VCSEL, which are ascertained in light of the VCSEL characterization.

13. The method as recited in claim 12, wherein using the first exposure wavefront and/or using the second exposure wavefront, a correction of a peak wavelength generated by the VCSEL is imprinted into the transmission hologram using Bragg equations.

14. The method as recited in claim 11, wherein the two different exposure wavefronts are coherent with respect to each other and/or are generated by a common source of radiation, the common source of radiation being a common spatial light modulator.

15. A method for producing micro-optics on Vertical-Cavity Surface-Emitting Laser (VCSEL) diodes, the method comprising:

in a wafer-level operation, positioning the micro-optics directly on the VCSEL's of a wafer wherein the micro-optics form transmission holograms.

* * * * *